US007447835B2

(12) United States Patent
Fujiwara et al.

(10) Patent No.: US 7,447,835 B2
(45) Date of Patent: Nov. 4, 2008

(54) DETERMINING THE ACCESSIBILITY OF A PORTABLE STORAGE DEVICE USING FORMAT AND ACCESS RIGHT INFORMATION

(75) Inventors: Masato Fujiwara, Kanagawa (JP); Masumi Ishiwatari, Kanagawa (JP); Takeyuki Higashibata, Tokyo (JP); Tadashi Takayama, Kanagawa (JP); Noriyuki Suzuki, Tokyo (JP); Hiroyasu Ito, Tokyo (JP); Makoto Kobayashi, Kanagawa (JP); Mamoru Yoshimoto, Kanagawa (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 11/460,316

(22) Filed: Jul. 27, 2006

(65) Prior Publication Data

US 2006/0262443 A1    Nov. 23, 2006

Related U.S. Application Data

(63) Continuation of application No. 10/726,277, filed on Dec. 2, 2003, now Pat. No. 7,213,119.

(30) Foreign Application Priority Data

Dec. 5, 2002    (JP) ............................. 2002-353876
Dec. 18, 2002   (JP) ............................. 2002-366692

(51) Int. Cl.
  *G06F 12/00* (2006.01)
  *G11B 17/04* (2006.01)
(52) U.S. Cl. ..................... 711/112; 711/115; 711/154; 710/13; 360/99.06
(58) Field of Classification Search ............... 711/115, 711/112, 154; 710/13; 360/99.06
See application file for complete search history.

(56) References Cited

U.S. PATENT DOCUMENTS

| 6,490,667 | B1 | 12/2002 | Ikeda |
| 6,540,523 | B1* | 4/2003 | Kung et al. .................. 439/64 |
| 6,611,907 | B1* | 8/2003 | Maeda et al. ............... 711/170 |
| 2003/0007335 | A1 | 1/2003 | Roscoe et al. |
| 2003/0073350 | A1 | 4/2003 | Shimada |
| 2003/0145183 | A1 | 7/2003 | Muehring |

FOREIGN PATENT DOCUMENTS

| JP | 62-196782 A | 8/1987 |
| JP | 3113690 A | 5/1991 |
| JP | 04-014675 A | 1/1992 |
| JP | 4-195597 A | 7/1992 |
| JP | 10-254649 A | 9/1998 |
| JP | 10-301719 A | 11/1998 |

* cited by examiner

*Primary Examiner*—Shane M Thomas
(74) *Attorney, Agent, or Firm*—Rossi, Kimms & McDowell, LLP

(57) ABSTRACT

There is provided a portable storage device which makes it possible to largely reduce time that is taken to remove the storage cartridge that is inserted and cannot be handled. A removable hard disk cartridge contains a hard disk and a control circuit for control of writing and reading of data in and from the hard disk in a casing thereof. A main unit includes an automatic loading/ejecting mechanism that receives the hard disk cartridge into a predetermined inner position within the main unit and ejects the same out from the position, and a microprocessor that controls storage operation for storing data in the hard disk cartridge. Before the automatic loading/ejecting mechanism performs a receiving operation, it is determined whether access to contents recorded on the hard disk can be gained, and when the access cannot be gained, the receiving operation by the automatic loading/ejecting mechanism is inhibited.

12 Claims, 13 Drawing Sheets

DETERMINING THE ACCESSIBILITY OF A PORTABLE STORAGE DEVICE USING FORMAT AND ACCESS RIGHT INFORMATION

This is a continuation of application Ser. No. 10/726,277, filed 2 Dec. 2003, now U.S. Pat. No. 7,213,119.

BACKGROUND OF THE INVENTION

1. Field of the Invention

The present invention relates to a portable storage device in which a storage cartridge containing a storage medium is removably loaded, a method of controlling the portable storage device, a control program for executing the method, and an electronic information apparatus including the portable storage device.

2. Description of the Related Art

Conventionally, there has been made progress in the downsizing and performance improvement of component parts used in information processors, and portable notebook personal computers are now widely used. The proliferation of personal computers including the notebook personal computers is very remarkable, and an increasing number of people own, for example, a desktop personal computer and a notebook personal computer at their workplaces, and a plurality of personal computers at home.

Under these circumstances, users desire to manage data stored in a hard disk within a personal computer in a centralized fashion, or carry a large volume of data to use the data with a plurality of personal computers as required.

Further, due to the widespread use of digital cameras and digital video cameras, there are a increasing number of occasions when images taken by the cameras are processed. The images taken by a digital camera or video camera have large data volume, and especially the data volume of a moving picture is very large, which causes a problem that the capacity of a hard disk for storing such images becomes insufficient in a short time.

To overcome this problem, the capacity of newly-developed hard disks is increasing at a very sharp rate year after year. In the meanwhile, users using a hard disk with a small capacity come to have an increasing desire to replace the currently used hard disk with one having a larger capacity.

To cope with these demands and problems, there has been proposed a portable storage device easy to carry, which uses a removable portable storage cartridge (hereinafter referred to as "a removable hard disk cartridge") that contains a hard disk and is easily replaceable.

In the portable storage device of the above-mentioned type, however, it is necessary for a user to manually load/unload a removable hard disk cartridge in/from a main unit, and hence the removable hard disk cartridge can be erroneously removed from the main unit during access to its hard disk. If this happens, data stored in the hard disk can be destroyed, and in the worst case, all of important data is lost.

Another demand is that a removable hard disk cartridge can be automatically loaded/unloaded in/from the main unit as easily as a VTR cassette.

To meet the demand, a loading device enabling automatic operation for loading/ejecting a removable hard disk cartridge, using a simple means has been proposed by the present assignee e.g. in Japanese Patent Application No. 2002-364308.

Further, there has been proposed a disk array device including an automatic ejecting mechanism for automatically ejecting a damaged disk drive or the like (see e.g. Japanese Laid-Open Patent Publications (Kokai) Nos. H10-254649 and H10-301719.)

However, as is well known, the hard disk device is vulnerable to shock due to its mechanical construction. This vulnerability of the hard disk has been overcome to some extent due to various technical improvements recently attained, with increased shock-resistance thereof. Nevertheless, it is still desirable to prevent shock or impact from being applied to the hard disk device during access operation for reading or writing, apart from when the hard disk device is in a standby state in which the magnetic head is in the shipping position.

However, when the automatic loading/ejecting mechanism is employed for loading/unloading the removable hard disk cartridge, accidental shock or impact can be applied to the hard disk device during access operation for reading or writing. To avoid this shock or impact, loading/ejecting operations can be performed only at an operating speed which causes practically no shock, or more precisely, at an operating speed which does not cause shock above a permissible level.

Thus, there is a limit imposed on the speed of loading/ejecting operations, and therefore, when an unintended disk is erroneously inserted, when a disk without an access right is inserted, or especially when an unformatted disk or a disk formatted in a format that is not compatible with the main unit is inserted, it takes time from loading of the disk to ejection of the same, which is annoying to the user.

In the prior art, however, no technical idea has been disclosed for increasing the speed of automatic loading/ejecting operations for a removable hard disk cartridge formatted in a format that cannot be handled or an unformatted removable hard disk cartridge.

Neither has been disclosed any technical idea for preventing data stored in a hard disk from being destroyed due to access to the hard disk during a loading operation or an ejecting operation.

SUMMARY OF THE INVENTION

It is a first object of the present invention to provide a portable storage device, a method of controlling the portable storage device, a control program for executing the method, an electronic information apparatus including the portable storage device, which make it possible to largely reduce time that is taken to remove a storage cartridge that cannot be handled when it is inserted.

It is a second object of the present invention to provide a portable storage device incorporating an automatic loading/ejecting mechanism, a method of controlling the portable storage device, a control program for executing the method, an electronic information apparatus including the portable storage device, which are capable of performing loading/ejecting operations safely at a high speed when a removable hard disk cartridge is loaded or ejected.

To attain above described first object, in a first aspect of the present invention, there is provided a portable storage device comprising a storage cartridge including a storage medium, a storage medium control device that performs writing of data in the storage medium and reading of data from the storage medium, and a casing that contains the storage medium and the storage medium control device, a main unit including a receiving and ejecting device that receives the storage cartridge from an outside of the main unit into a predetermined inner position within the main unit, and ejects the storage cartridge out of the main unit from the predetermined inner position, and a storage operation control device that controls storage operation for storing data in the storage cartridge, an accessibility determining device that determines whether or not access to contents recorded on the storage medium can be gained before the receiving and ejecting device performs a receiving operation, and a reception inhibiting device that inhibits the receiving and ejecting device from performing the receiving operation when the accessibility determining device determines that the access cannot be gained.

With the arrangement of the portable storage device according to the first aspect of the present invention, before the receiving and ejecting device a receiving operation for receiving a storage cartridge from outside the main unit into the predetermined inner position within the same, the accessibility determining device determines whether access to the contents recorded on the storage medium can be gained, and when the accessibility determining device determines that the access cannot be gained, the receiving and ejecting device is inhibited from performing the receiving operation. Therefore, even when a storage cartridge that cannot be handled is inserted, the receiving and ejecting device need not perform an operation for once receiving the storage cartridge, so that it is possible to largely reduce time that is taken to remove the storage cartridge that cannot be handled.

Preferably, the accessibility determining device determines whether or not the access can be gained by trying access to the storage medium.

With the arrangement of this preferred embodiment, it is possible to provide the same advantageous effect as described above.

Preferably, the storage cartridge includes another storage medium storing format information and access right information of the storage medium, and the accessibility determining device tries access to the other storage medium to thereby determine from the format information and the access right information whether or not the access can be gained.

With the arrangement of this preferred embodiment, it is possible to determine whether the access can be gained, by accessing the other storage medium storing format information and access right information on the storage medium, without accessing the storage medium directly.

More preferably, the other storage medium is a nonvolatile semiconductor memory.

With the arrangement of this preferred embodiment, since the other storage medium is a nonvolatile semiconductor memory, it is possible to determine whether the access can be gained more speedily.

More preferably, when the accessibility determining device tries access to the other storage medium but cannot determine that the access can be gained, the accessibility determining device tries access to the storage medium to thereby determine whether or not the access can be gained.

With the arrangement of this preferred embodiment, when it cannot be determined that the access can be gained by accessing the other storage medium storing format information and access right information on the storage medium, the accessibility determining device accesses the storage medium to thereby determine whether the access can be gained. This makes it possible to more positively determine whether or not the access can be gained.

More preferably, the accessibility determining device determines whether or not the access can be gained by determining whether or not the storage medium is formatted.

With the arrangement of this preferred embodiment, the accessibility determining device determines whether or not the access can be gained by determining whether or not the storage medium is formatted. This makes it possible to positively prevent an unformatted storage medium from being received.

More preferably, the accessibility determining device determines whether or not the access can be gained by determining whether or not the storage medium is controllably formatted.

With the arrangement of this preferred embodiment, the accessibility determining device determines whether or not the access can be gained by determining whether or not the storage medium is formatted in a controllable form. This makes it possible to positively prevent a storage medium in a uncontrollable format from being received.

More preferably, the accessibility determining device determines whether or not the access can be gained by determining whether or not a user has an access right to the storage medium.

With the arrangement of this preferred embodiment, the accessibility determining device determines whether or not the access can be gained by determining whether or not a user has an access right to the storage medium. This makes it possible to positively prevent a user who does not have the access right from accessing the contents.

Further preferably, the receiving and ejecting device is responsive to a determination by the accessibility determining device that the access can be gained, for receiving the storage cartridge into the predetermined inner position substantially simultaneously with completion of the determination.

With the arrangement of this preferred embodiment, when the accessibility determining device can determine that the access can be gained, the receiving and ejecting device receives the storage cartridge into the predetermined inner position almost simultaneously with completion of the determination. Therefore, it is possible to reduce time for receiving the storage cartridge, and therefore it is possible to provide excellent operability.

Further preferably, the portable storage device as further comprises a notification device which is responsive to a determination by the accessibility determining device that the access cannot be gained, for notifying a user that the access cannot be gained.

With the arrangement of this preferred embodiment, the user can be informed that the access cannot be gained, without delay.

Even more preferably, the portable storage device further comprises a format process device which is responsive to a determination by the accessibility determining device that the access cannot be gained, for asking the user whether or not the storage medium is to be formatted, and is responsive to an instruction by the user that the storage medium is to be formatted, for causing the storage cartridge to be received into the predetermined inner position and formatting the storage medium in a controllable format.

With the arrangement of this preferred embodiment, when a storage medium that cannot be accessed is to be formatted, the storage cartridge is received into the predetermined inner position and formatted in a controllable form, which makes the portable storage device user-friendly.

Preferably, when the formatting is executed, format information on the format of the storage medium is written into the other storage medium.

With the arrangement of this preferred embodiment, format information on the controllable format into which the storage medium is formatted is written in the other storage medium, so that from then on, by accessing the other storage medium, it is possible to determine whether or not the access can be gained from the format information.

Preferably, when the access right is changed during use of the storage cartridge, access right information on the changed access right is written into the other storage medium.

With the arrangement of this preferred embodiment, access right information on the access right which is changed during use of the storage medium is written in the other storage medium, so that from then on, by accessing the other storage medium, it is possible to determine whether the access can be gained from the access right information.

To attain the first object, in a second aspect of the present invention, there is provided an electronic information apparatus including the portable storage according to the first aspect of the present invention.

With the arrangement of the electronic information apparatus according to the second aspect of the present invention, it is possible to largely reduce time that is taken to remove the storage cartridge that cannot be handled.

To attain the first object, in a third aspect of the present invention, there is provided a method of controlling a portable storage device, comprising a storage medium control step of performing writing of data in a storage medium contained in a storage cartridge and reading of data from the storage medium, a receiving and ejecting step of receiving the storage cartridge from outside a main unit into a predetermined inner position within the main unit, and ejecting the storage cartridge out of the main unit from the predetermined inner position, a storage operation control step of controlling storage operation for storing data in the storage cartridge, an accessibility determining step of determining whether or not access to contents recorded on the storage medium an be gained, before a receiving operation is performed in the receiving and ejecting step, and an reception inhibiting step of inhibiting the receiving operation from being performed in the receiving and ejecting step when it is determined in the accessibility determining step that the access cannot be gained.

With the arrangement of the method according to the third aspect of the invention, before a receiving operation is performed for receiving the storage cartridge from outside the main unit into the predetermined inner position within the main unit in the receiving and ejecting step, it is determined in the accessibility determining step whether or not access to contents recorded on the storage medium can be gained, and when it is determined that the access cannot be gained, the receiving operation in the receiving and ejecting step is inhibited from being performed. Therefore, even when a storage cartridge that cannot be handled is inserted, the operation for once receiving the storage cartridge need not be executed, so that it is possible to largely reduce time that is taken to remove the storage cartridge that cannot be handled.

To attain the first object, in a fourth aspect of the present invention, there is provided a control program for causing a computer to execute the method of controlling a portable storage device according to the third aspect of the present invention.

With the arrangement of the control program according to the fourth aspect of the present invention, it is possible to provide the same advantageous effect as obtained by the control method according to the third aspect of the present invention described above.

To attain the second object of the present invention, in a fifth aspect of the present invention, there is provided a portable storage device comprising a storage cartridge including a storage medium, a storage medium control device that performs writing of data in the storage medium and reading of data from the storage medium, and a casing that contains the storage medium and the storage medium control device, a main unit including a receiving and ejecting device that receives the storage cartridge from an outside of the main unit into a predetermined inner position within the main unit, and ejects the storage cartridge out of the main unit from the predetermined inner position, and a storage operation control device that controls storage operation for storing data in the storage cartridge, a receiving/ejecting operation determining device that determines an operative state of the receiving and ejecting device, and an access inhibiting device that inhibits access to the storage medium based on control by the storage operation control device from being gained, depending on a result of the determination by the receiving/ejecting operation determining device.

With the arrangement of the portable storage device according to the fifth aspect of the present invention, the receiving/ejecting operation determining device determines the operative state of the receiving and ejecting device that receives a storage cartridge from the outside of the main unit into the predetermined inner position within the main unit, and ejects the storage cartridge out of the main unit from the predetermined inner position, and then the access inhibiting device inhibits access to the storage medium based on control by the storage operation control device from being gained, depending on a result of the determination by the receiving/ejecting operation determining device. This makes it possible to positively inhibit access to the storage medium when it is necessary to inhibit the access so as to prevent occurrence of an accident due to erroneous access, thereby ensuring enhanced safety. Further, a time at which a removable hard disk cartridge can be received/ejected can be determined by the receiving/ejecting operation determining device, which makes it possible to perform loading/ejecting operation at a high speed, when the time is reached.

Preferably, the receiving/ejecting operation determining device determines which of a standby state in which a loading operation for receiving the storage cartridge is awaited, a loading state in which the loading operation is being performed, a loading completed state in which the loading operation has been completed, and an ejecting state in which an ejecting operation for ejecting the storage cartridge is being performed, the operative state of the receiving and ejecting device corresponds to, and when the operative state corresponds to one of the loading state and the ejecting state, the access inhibiting device inhibits the access to the storage medium based on control by the storage operation control device from being gained.

With the arrangement of this preferred embodiment, the receiving/ejecting operation determining device is capable of determining which of a standby state in which a loading operation for receiving the storage cartridge is awaited, a loading state in which the loading operation is being performed, a loading completed state in which the loading operation has been completed, and an ejecting state in which an ejecting operation for ejecting the storage cartridge is being performed, the operative state of the receiving and ejecting device corresponds to, and when the operative state corresponds to one of the loading state and the ejecting state, the access inhibiting device inhibits the access to the storage medium based on control by the storage operation control device from being gained. This makes it possible to more positively inhibit the access when it should be inhibited.

More preferably, when the operative state of the receiving and ejecting device corresponds to a state other than the loading completed state, the access inhibiting device inhibits the access to the storage medium based on control by the storage operation control device from being gained.

With the arrangement of this preferred embodiment, when the operative state of the receiving and ejecting device corresponds to a state other than the loading completed state, the access inhibiting device inhibits the access to the storage medium based on control by the storage operation control device from being gained. This makes it possible to inhibit the access to the storage medium more positively when it is necessary to inhibit the access.

More preferably, the access inhibiting device inhibits the access to the storage medium based on control by the storage operation control device from being gained, by providing control such that operations are performed in the same manner as in a case where the storage cartridge is actually unloaded, irrespective of whether or not the storage cartridge is physically loaded in the main unit.

With the arrangement of this preferred embodiment, the access inhibiting device provides control such that operations are performed in the same manner as in a case where the storage cartridge is actually unloaded, irrespective of whether or not the storage cartridge is physically loaded in the main unit. This makes it possible to more positively inhibit access to the storage medium.

Preferably, the access inhibiting device comprises a signal cutoff device that electrically cuts off at least part of electric signals transmitted between the storage operation control device and the storage cartridge.

With the arrangement of this preferred embodiment, at least part of electric signals transmitted between the storage operation control device and the storage cartridge is electrically cut off. Therefore, it is possible to positively inhibit the access to the storage medium.

More preferably, the signal cutoff device comprises a semiconductor device.

With the arrangement of this preferred embodiment, the size of the signal cutoff device can be reduced. This makes it possible to promote downsizing of the portable storage device.

To attain the second object, in a sixth aspect of the present invention, there is provided an electronic information apparatus including the portable storage device according to the fifth aspect of the present invention.

With the arrangement of the electronic information apparatus according to the sixth aspect of the present invention, when the removable hard disk cartridge is loaded or ejected, it is possible to perform a loading or ejecting operation more speedily and safely than in the prior art.

To attain the second object, in a seventh aspect of the present invention, there is provided a method of controlling a portable storage device, comprising a storage medium control step of performing writing of data in a storage medium contained in a storage cartridge and reading of data from the storage medium, a receiving and ejecting step of causing a receiving and ejecting device to receive the storage cartridge from outside a main unit into a predetermined inner position within the main unit, and eject the storage cartridge out of the main unit from the predetermined inner position, a storage operation control step of controlling a storage operation for storing data in the storage cartridge, a receiving/ejecting operation determining step of determining an operative state of the receiving and ejecting device, and an access inhibiting step of inhibiting access to the storage medium based on control in the storage operation control step from being gained, depending on a result of the determination in the receiving/ejecting operation determining step.

With the arrangement of the method according to the seventh aspect of the present invention, the operative state of the receiving and ejecting device that receives a storage cartridge from outside into the predetermined inner position, and ejects the storage cartridge outside from the predetermined inner position is determined in the receiving/ejecting operation determining step, and then access to the storage medium based on control in the storage operation control step is inhibited in the access inhibiting step, depending on a result of the determination in the receiving/ejecting operation determining step. This makes it possible to positively inhibit the access to the storage medium when it is necessary to inhibit the access so as to prevent occurrence of an accident due to erroneous access, thereby ensuring enhanced safety. Further, a time at which a removable hard disk cartridge can be received/ejected can be determined in the receiving/ejecting operation determining step, which makes it possible to perform loading/ejecting operation at a high speed, when the time is reached.

To attain the second object, in an eighth aspect of the present invention, there is provided a control program for causing a computer to execute the method of controlling a portable storage device according to the seventh aspect of the invention.

With the arrangement of the control program according to the eighth aspect of the present invention, it is possible to provide the same advantageous effects as obtained by the control method according to the seventh aspect of the present invention described above.

The above and other objects, features, and advantages of the present invention will become more apparent from the following detailed description taken in conjunction with the accompanying drawings.

DETAILED DESCRIPTION OF THE PREFERRED EMBODIMENTS

The present invention will now be described with reference to the drawings showing preferred embodiments thereof.

Figure 1:
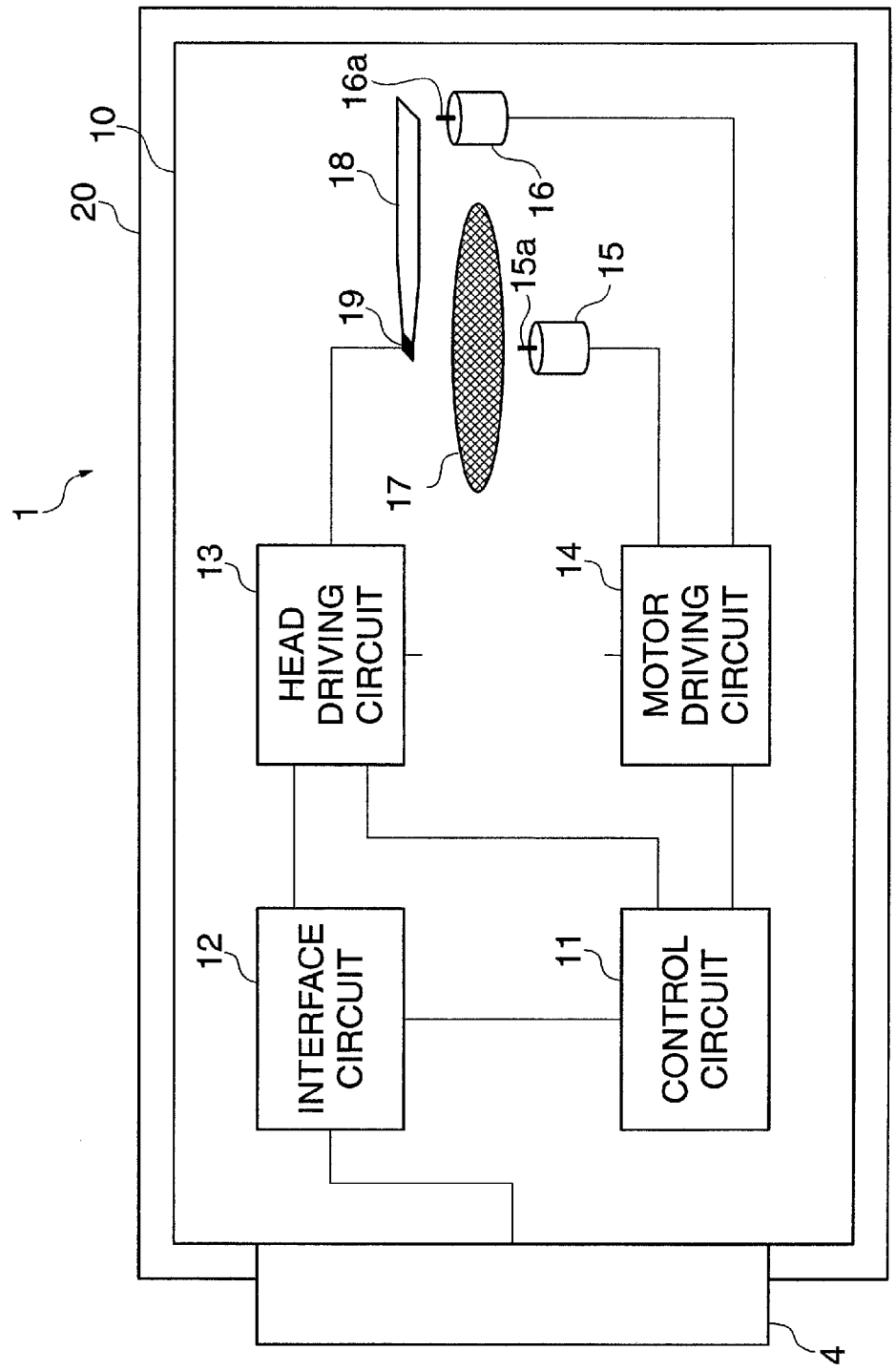
FIG. 1 is a diagram schematically showing the configuration of a portable storage cartridge as a component of a portable storage device according to a first embodiment of the present invention.
Figure 2:
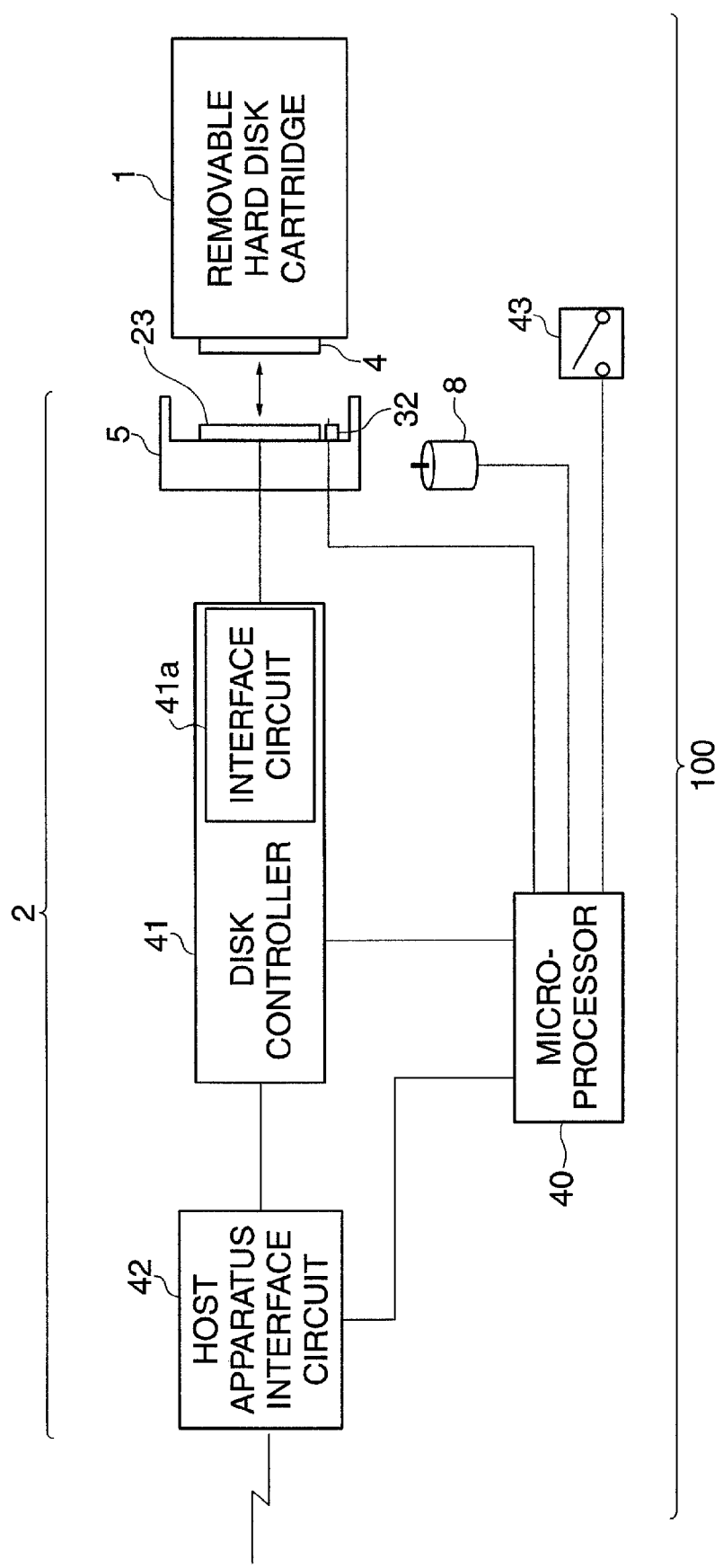
FIG. 2 is a block diagram schematically showing the arrangement of the portable storage cartridge appearing in FIG. 1 and a main unit for receiving the removable hard disk cartridge.

FIG. 1 is a diagram schematically showing the arrangement of a portable storage cartridge according to a first embodiment of the present invention. FIG. 2 is a block diagram showing the arrangement of the portable storage cartridge shown in FIG. 1 and a main unit for receiving the same.

As shown in FIG. 1, the portable storage cartridge 1 (hereinafter referred to as "the removable hard disk cartridge 1") is comprised of a casing 20 formed e.g. of a molded member, and a hard disk drive device 10 contained in the casing 20. The casing 20 has an opening at one end thereof, and a connector 4 is attached to the opening, for connection to a main unit 2 (see FIG. 2) described in detail hereinafter.

Next, a description will be given of individual components of the hard disk drive device 10.

A control circuit 11 controls the overall operation of the removable hard disk cartridge 1, and an interface circuit 12, a head driving circuit 13, and a motor driving circuit 14 are connected to the control circuit 11.

The motor driving circuit 14 drives a pair of motors 15, 16. A magnetic recording medium 17 (hereinafter referred to as "the hard disk 17") is engaged with a rotational shaft 15a of the motor 15, while one end of a head arm 18 is engaged with a rotational shaft 16a of the motor 16. The hard disk 17 is driven for rotation by the motor 15, and the head arm 18 is driven for seek operation by the motor 16. The head driving circuit 13 drives a magnetic head 19 provided at the other end of the head arm 18, for reading data from a desired location of the hard disk 17 or writing data into a desired location of the same.

The data read or written by the magnetic head 19 is transferred between the removable hard disk cartridge 1 and the main unit 2 via the interface circuit 12 and the connector 4. The interface circuit 12 is implemented by a known interface, such as SCSI (Small Computer System Interface) or IDE (ATA) (IDE; Integrated Drive Electronics, ATA; AT Attachment), and the removable hard disk cartridge 1 functions as a disk device connected to the main unit 2 by the interface.

As shown in FIG. 2, a microprocessor 40 controls the overall operation of the portable storage device 100. In the microprocessor 40, a CPU, a ROM, a RAM, and an I/O, none of which are shown, are integrated into a single chip. A disk controller 41 includes an interface circuit 41a corresponding to the interface circuit 12 described above with reference to FIG. 1. The portable storage device 100 has a host apparatus interface circuit 42 for connecting itself to an external host apparatus, such as a personal computer. The host apparatus interface circuit 42 is implemented by a known interface, such as USB (Universal Serial Bus) or IEEE (Institute of Electrical and Electronic Engineers) 1394. The portable storage device 100 functions as a removable storage device connected to the external personal computer or the like via the interface.

The main unit 2 has a tact switch 43 (pushbutton switch) provided therein for enabling a user to instruct ejection of the removable hard disk cartridge 1 received in the main unit 2. Ejection of the removable hard disk cartridge 1 can be instructed not only by depressing the tact switch 43, but also by issuing a command from the host apparatus.

The portable storage device 100 has an automatic loading/ejecting mechanism 5 disposed in a part thereof for receiving the removable hard disk cartridge 1. The automatic loading/ejecting mechanism 5 is driven by a pulse motor 8. There are two types of main units 2, i.e. a type incorporated in a personal computer, and the other separate from a personal computer and connectable to the same.

The automatic loading/ejecting mechanism 5 is provided with a connector 23 for connection with the connector 4 of the removable hard disk cartridge 1, and a microswitch 32 for detecting insertion of the removable hard disk cartridge 1 into the automatic loading/ejecting mechanism 5. Although not shown in FIG. 1 or 2, not only signal lines from the associated interface circuits but also a power supply line extends through the connector 4 and the connector 23, and the removable hard disk cartridge 1 is supplied with power from the main unit 2 via the power supply line, for operation. The connector 4 and the connector 23 are of a hot-plug type constructed such that associated terminals of the two connectors used for the power supply line are brought into contact with each other in timing different from timing in which associated terminals of the same used as for the signal lines are brought into contact with each other.

Next, the mechanical construction of the automatic loading/ejecting mechanism 5 will be described with reference to FIGS. 3 and 4.

Figure 3:
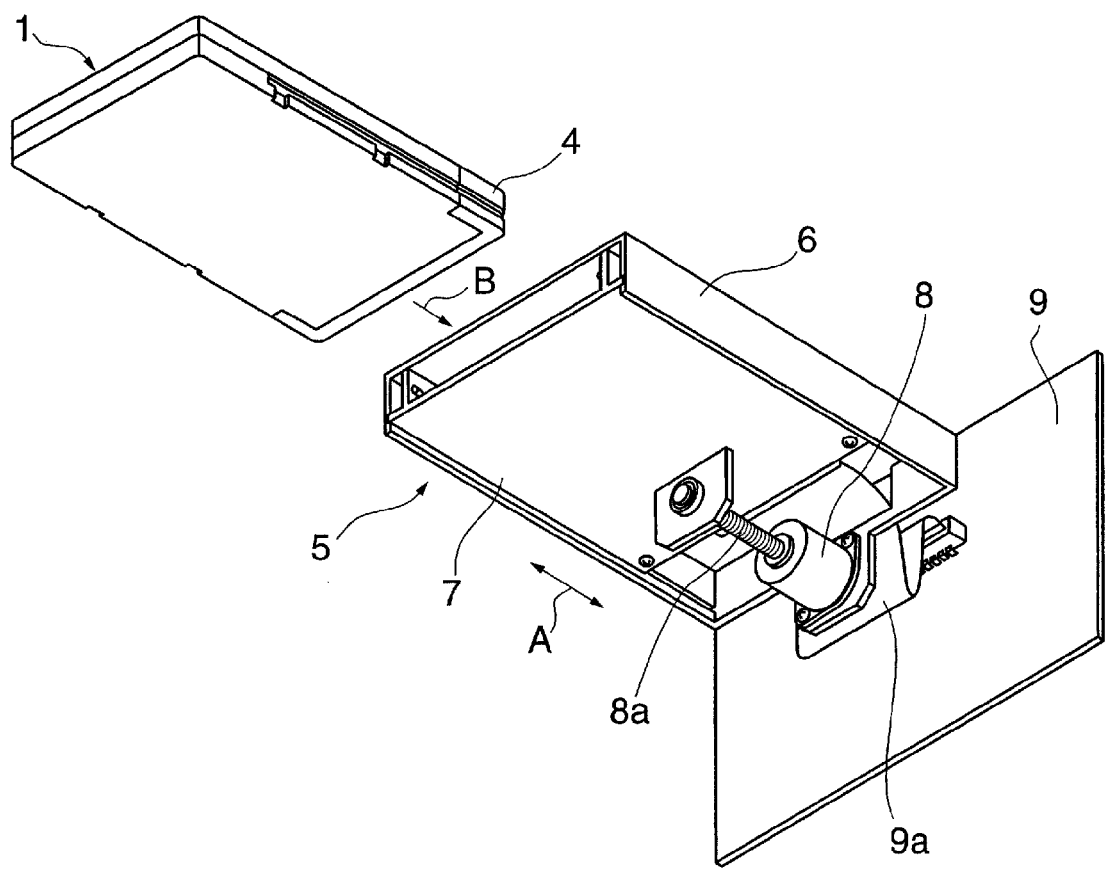
FIG. 3 is a perspective view showing the portable storage cartridge and an automatic loading/ejecting mechanism as viewed from below.
Figure 4:
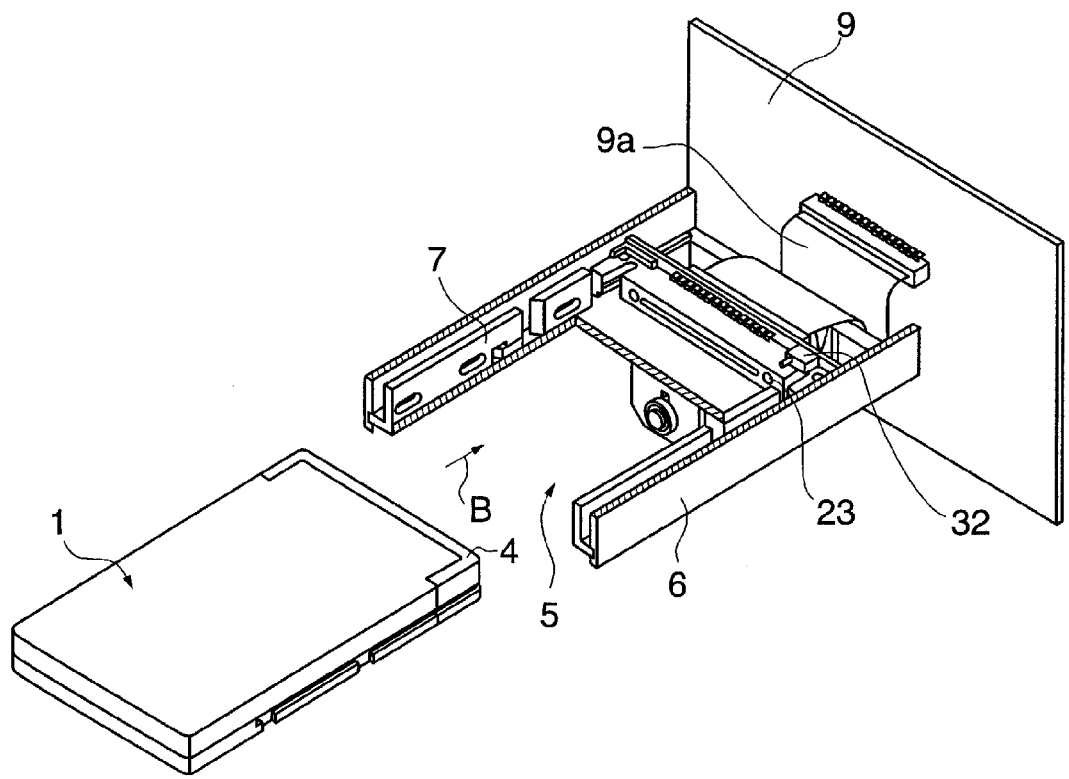
FIG. 4 is a partly cut-away perspective view showing the portable storage cartridge and the automatic loading/ejecting mechanism appearing in FIG. 3, as viewed from above.

FIG. 3 is a perspective view of the removable hard disk cartridge 1 and the automatic loading/ejecting mechanism 5, as viewed from below. FIG. 4 is a partly cut-away perspective view of the removable hard disk cartridge 1 and the automatic loading/ejecting mechanism 5 in FIG. 3, as viewed from above.

The entire automatic loading/ejecting mechanism 5 is supported by a frame 6. A pallet 7 is used for placing the removable hard disk cartridge 1 thereon and supported by the frame 6 such that the removable hard disk cartridge 1 can reciprocate along grooves (not shown) formed in the frame 6 in directions indicated by a double-headed arrow A, with the pulse motor 8 connected thereto via a screw rotary shaft 8a. As the rotary shaft 8a rotates along with rotation of the pulse motor 8, the pallet 7 moves in the directions indicated by the double-headed arrow A. The connector 23 and the microswitch 32 are disposed at a connecting end of the pallet 7.

The microprocessor 40 and the circuits described with reference to FIG. 2 are mounted on a printed circuit board 9. It should be noted that the printed circuit board 9 and the connector 23 are interconnected by wiring members including a flexible cable 9a.

Now, a description will be given of the outline of loading/ejecting operation. When the removable hard disk cartridge 1 is inserted into the automatic loading/ejecting mechanism 5 (in a direction indicated by an arrow B), and the connector 4 of the removable hard disk cartridge 1 reaches a position where the connector 4 is properly fitted with the connector 23 of the main unit 2, the connecting end of the removable hard disk cartridge 1 depresses the microswitch 32, whereby the microswitch 32 is changed from an open position to a closed position. The microprocessor 40 is capable of electrically sensing this position change of the microswitch 32 to thereby detect whether or not the removable hard disk cartridge 1 has been inserted into the automatic loading/ejecting mechanism 5.

It should be noted that when the connector 4 and the connector 23 are properly fitted with each other, the supply of electric power to the removable hard disk cartridge 1 is started regardless of the loading operation.

Upon detection of the insertion of the removable hard disk cartridge 1 into the automatic loading/ejecting mechanism 5, the microprocessor 40 causes the pulse motor 8 to perform counterclockwise rotation by a predetermined number of rotations to thereby retract the pallet 7 with the removable hard disk cartridge 1 placed thereon. Thus, the automatic loading operation for the removable hard disk cartridge 1 is performed.

On the other hand, when the tact switch 43 is released from the depressed state, or when a command instructing ejection of the removable hard disk cartridge 1 is received from the host apparatus, the microprocessor 40 causes the pulse motor 8 to perform clockwise rotation by a predetermined number of rotations to push the pallet 7 with the removable hard disk cartridge 1 placed thereon, outward from the automatic loading/ejecting mechanism 5 (in an opposite direction to the direction indicated by the arrow B). Thus, the automatic ejecting operation is performed for the removable hard disk cartridge 1.

Before the removable hard disk cartridge 1 is ejected, the microswitch 32 remains depressed (in the closed position), but since the insertion of the removable hard disk cartridge 1 is detected only when the microswitch 32 is changed from the open position to the closed position, the loading operation is not allowed to start during the ejecting operation. The loading operation is executed next only when the removable hard disk cartridge 1 is inserted again to depress the microswitch 32, after having been removed once.

Figure 5:
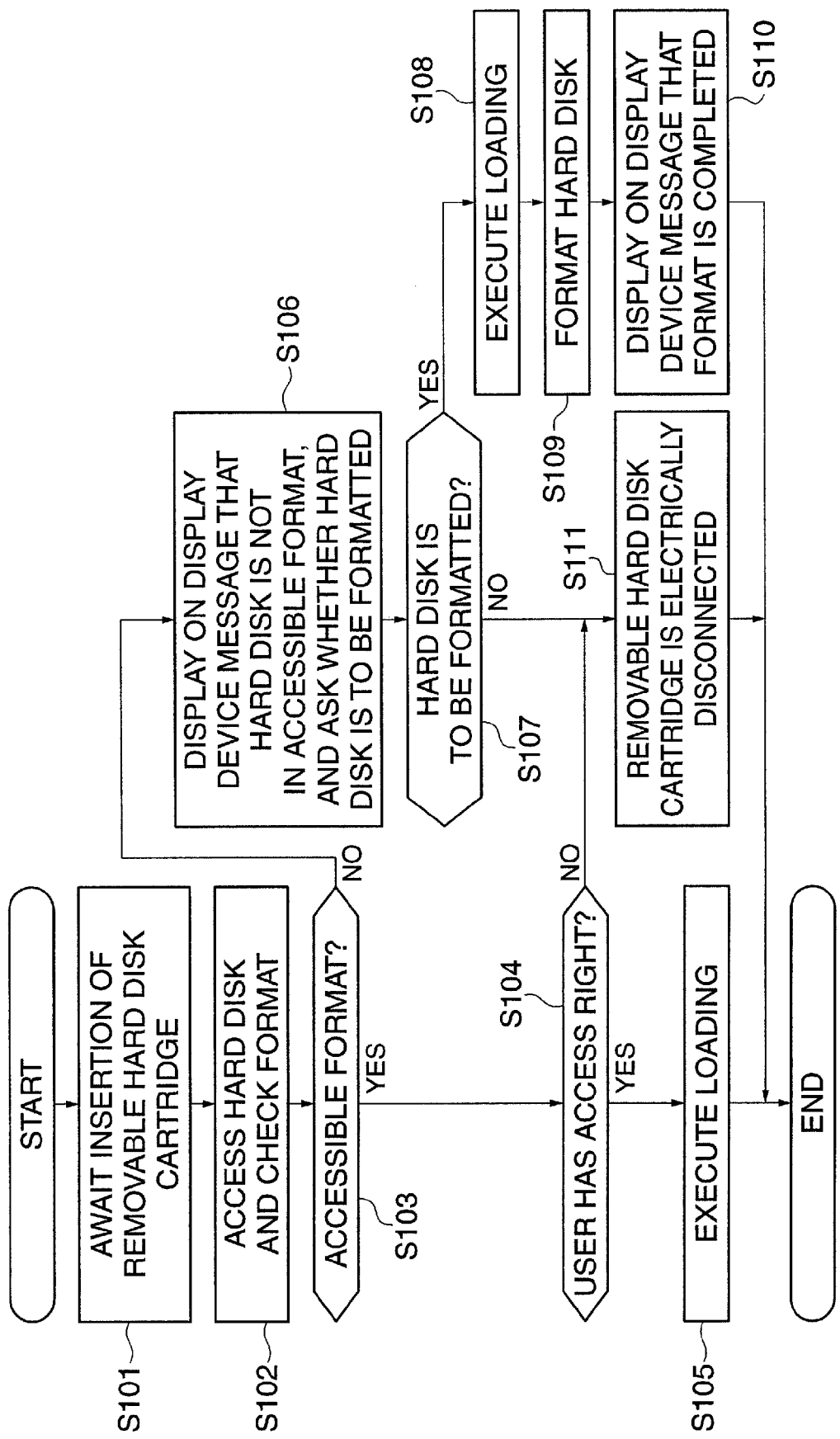
FIG. 5 is a flowchart of a loading process executed by a microprocessor appearing in FIG. 2.

FIG. 5 is a flowchart of a loading process executed by the microprocessor 40 appearing in FIG. 2.

First, in a step S101, insertion of the removable hard disk cartridge 1 into the main unit 2 is awaited. When the removable hard disk cartridge 1 is inserted into the main unit 2, the removable hard disk cartridge 1 is checked (S102) to know whether it is in an accessible format. This check is performed by driving the removable hard disk cartridge 1 via the connector 4 and thereby trying access to the hard disk 17 to read the contents of the same. An access right, described in detail hereinafter, may be checked in the step S102.

Then, in a step S103, it is determined whether or not the removable hard disk cartridge 1 is in an accessible format. If the removable hard disk cartridge 1 is in an accessible format, the process proceeds to a step S104, wherein it is determined whether or not the user has an access right. If the user has an access right, a loading operation is carried out in a step S105 to receive the removable hard disk cartridge 1 into a predetermined inner position in the main unit 2, followed by terminating the present loading process.

If it is determined in the step S104 that the user does not have an access right, the removable hard disk cartridge 1 is electrically disconnected from the main unit 2 in a step S111, followed by terminating the present loading process. This prevents the removable hard disk cartridge 1 from being loaded into the main unit 2, thereby enabling the same to be removed from the main unit 2 immediately.

If it is determined in the step S103 that the removable hard disk cartridge 1 is not in an accessible format, a message to the effect that the removable hard disk cartridge 1 is not accessible is displayed on a display device (not shown), and at the same time the user is questioned whether or not the hard disk 17 is to be formatted (S106). In a step S107, it is determined whether or not the hard disk 17 is to be formatted. If the hard disk 17 is to be formatted, the process proceeds to a step S108, wherein a loading operation is carried out to receive the removable hard disk cartridge 1 into the predetermined inner position in the main unit 2, and in the following step S109, the hard disk 17 is formatted. Then, in a step S110, a message to the effect that the formatting is completed is displayed on the display device, followed by terminating the present loading process.

If it is determined in the step S107 that the hard disk 17 is not to be formatted, the removable hard disk cartridge 1 is electrically disconnected from the main unit 2 in the step S111, followed by terminating the present loading process. This prevents the removable hard disk cartridge 1 from being loaded into the main unit 2, thereby enabling the same to be removed from the main unit 2 immediately.

The object to be checked in the step S102 to know whether the removable hard disk cartridge 1 is accessible may be a storage medium other than the hard disk 17 described above, which is additionally incorporated in the removable hard disk cartridge 1.

Next, a description will be given of a portable storage device according to a second embodiment, as an example of the removable hard disk cartridge 1 incorporating a storage medium other than the hard disk 17.

Figure 6:
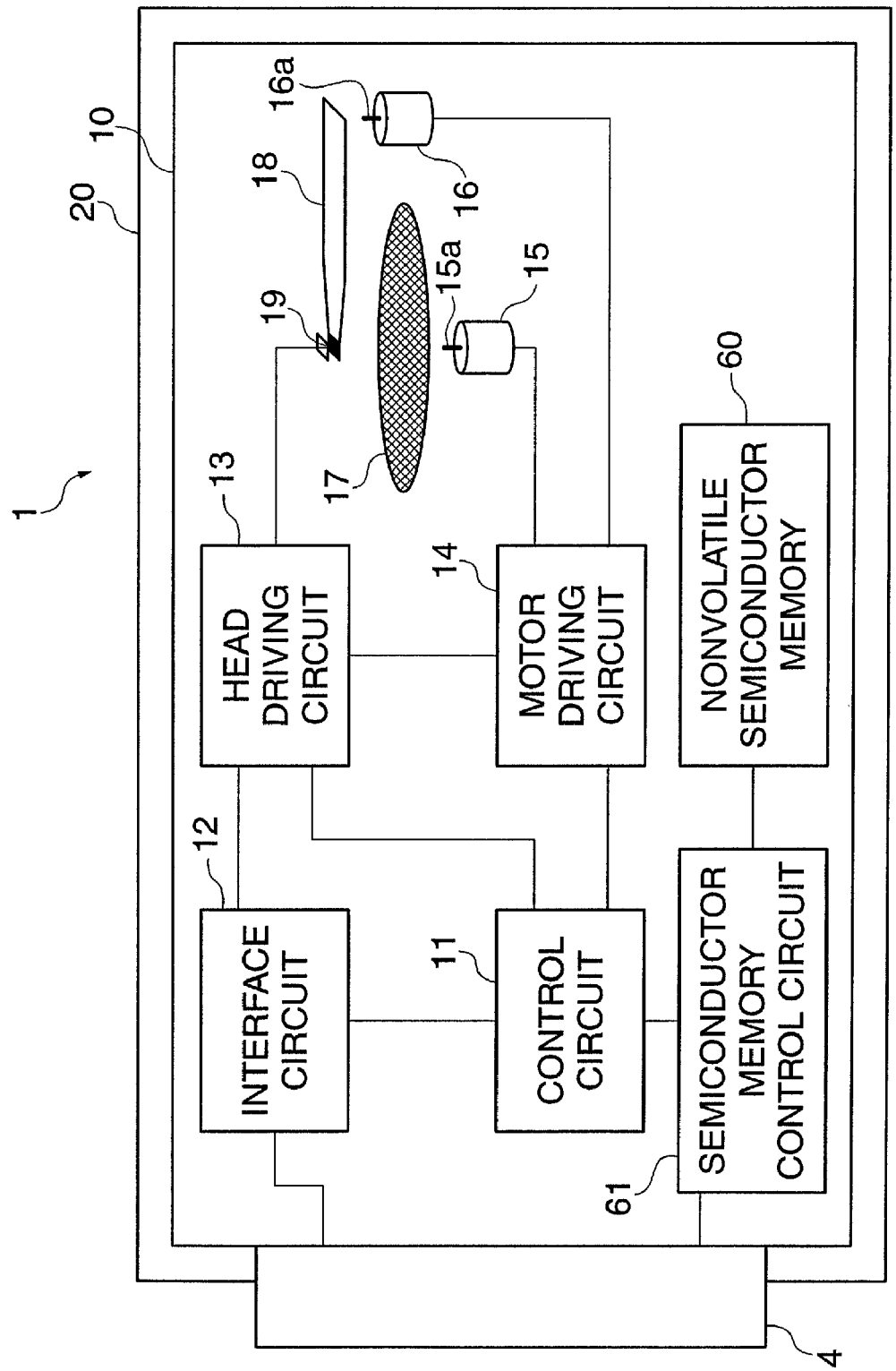
FIG. 6 is a diagram schematically showing the arrangement of a portable storage cartridge as a component of a portable storage device according to a second embodiment of the present invention.

FIG. 6 is a diagram schematically showing the arrangement of a portable storage cartridge as a component of the portable storage device according to the second embodiment of the present invention.

The portable storage cartridge 1 (removable hard disk cartridge 1) shown in FIG. 6 is distinguished from the removable hard disk cartridge 1 of the first embodiment only in that it includes a nonvolatile semiconductor memory 60 storing format information and access right information, and a semiconductor memory control circuit 61 for controlling the nonvolatile semiconductor memory 60, but the other component parts thereof are the same as the corresponding ones of the removable hard disk cartridge 1 of the first embodiment. The same component parts are designated by identical reference numerals, and duplicated descriptions thereof are omitted. Further, a main unit employed in the second embodiment is identical in construction to that employed in the first embodiment in FIG. 2, and therefore illustration and description thereof are omitted.

The nonvolatile semiconductor memory 60 stores the format information and access right information on the hard disk 17. Whenever the information is altered, it can be rewritten.

Figure 7A:
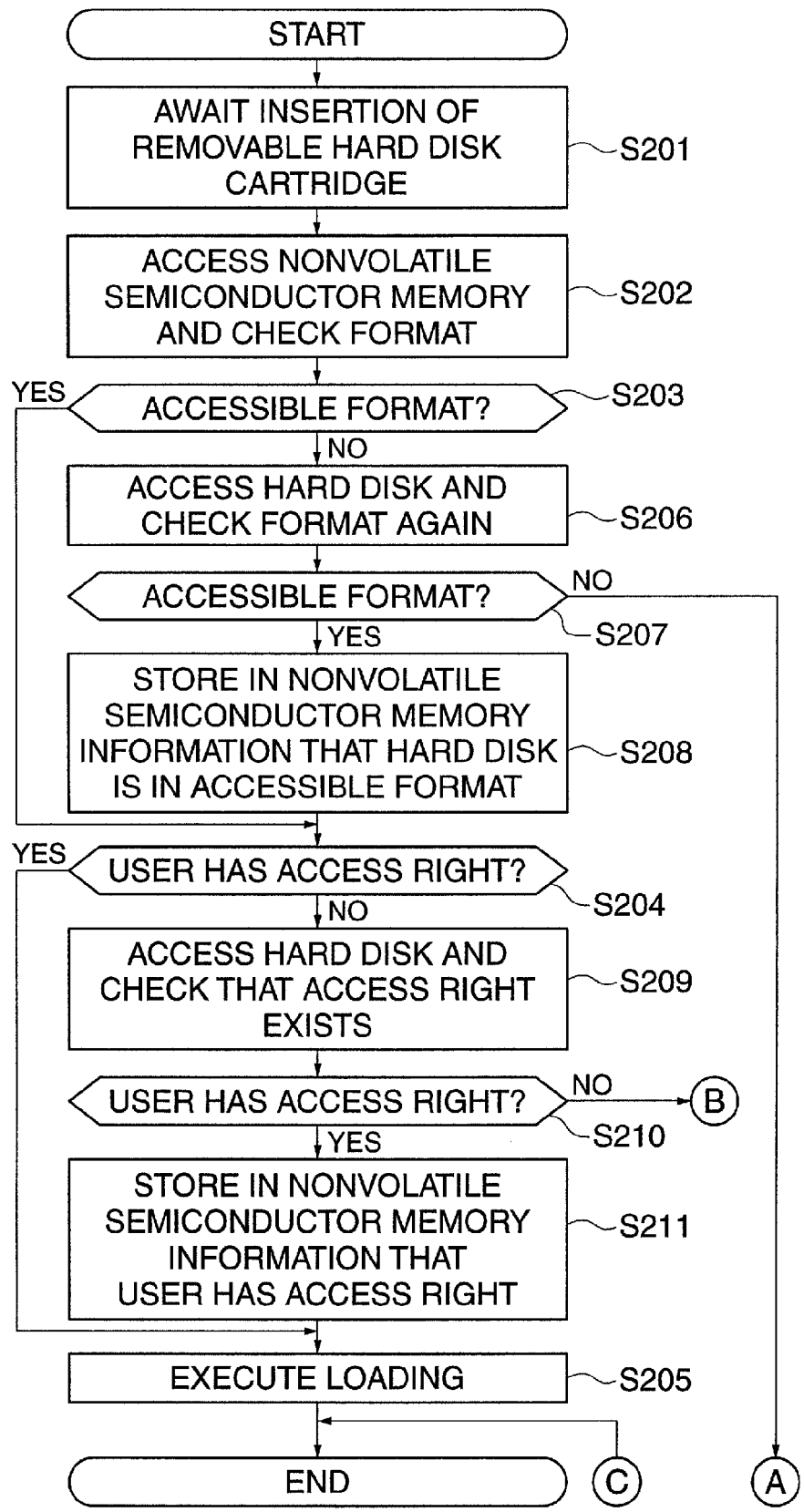
FIGS. 7A and 7B are flowchart of a loading process executed by the portable storage device according to the second embodiment.
Figure 7B:
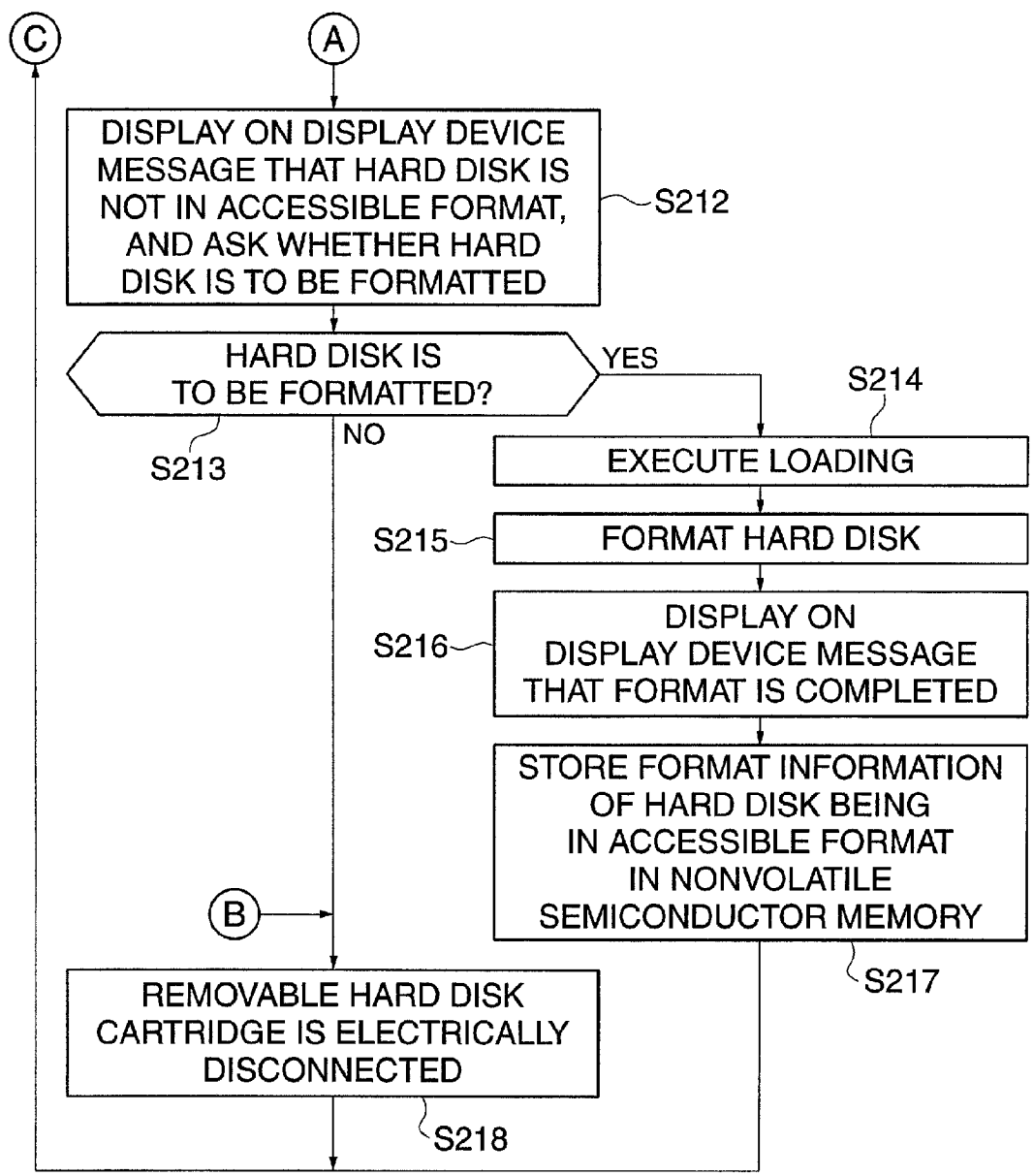

FIGS. 7A and 7B are flowchart of a loading process executed by the portable storage device according to the second embodiment.

First, in a step S201, insertion of the removable hard disk cartridge 1 into the main unit 2 is awaited. When the removable hard disk cartridge 1 is inserted into the main unit 2, the removable hard disk cartridge 1 is checked to know whether it is in an accessible format (S202). This check is performed by trying access to the nonvolatile semiconductor memory 60 to read the format information.

Then, in a step S203, it is determined whether or not the removable hard disk cartridge 1 is in an accessible format. If the removable hard disk cartridge 1 is in an accessible format, the process proceeds to a step S204, wherein it is determined whether or not the user has an access right. This determination is performed by reading the access right information from the nonvolatile semiconductor memory 60. If the user has an access right, the process proceeds to a step S105, wherein a loading operation is carried out to receive the removable hard disk cartridge 1 into a predetermined inner position in the main unit 2, followed by terminating the present loading process.

If it is determined in the step S203 that the removable hard disk cartridge 1 is not in an accessible format, i.e. if the nonvolatile semiconductor memory 60 has no format information recorded therein or it is formatted in a format that cannot be handled, the process proceeds to a step S206, wherein access to the hard disk 17 is tried so as to check the format thereof again. Then, in a step S207, it is determined whether or not the hard disk 17 is in an accessible format. If the hard disk 17 is in an accessible format, the information on the removable hard disk cartridge 1 being in the accessible format is stored in the nonvolatile semiconductor memory 60 (S208), followed by the process proceeding to the step 204.

If it is determined in the step S204 that the user does not have an access right, i.e. if the nonvolatile semiconductor memory 60 does not have the access right information recorded therein, the hard disk 17 is accessed in a step S209 so as to check the access right information. Then, in a step S210, it is determined whether or not the user has an access right. If the hard disk 17 has the access right information stored therein, which means that the user has an access right, the information on the user having an access right is stored in the nonvolatile semiconductor memory 60 (S211), followed by the process proceeding to the step S205, wherein a loading operation is carried out to receive the removable hard disk cartridge 1 into the predetermined inner position in the main unit 2, followed by terminating the present loading process.

If it is determined in the step S210 that the user does not have an access right to the hard disk 17, the removable hard disk cartridge 1 is electrically disconnected from the main unit 2 in the step S211, followed by terminating the present loading process. This prevents the removable hard disk cartridge 1 from being loaded into the main unit 2, thereby enabling the same to be removed from the main unit 2 immediately.

If it is determined in the step S207 that the removable hard disk cartridge 1 is not in an accessible format, a message to the effect that the removable hard disk cartridge 1 is not accessible is displayed on a display device (not shown), and at the same time the user is questioned whether the hard disk 17 is to be formatted (S212). Then, in a step S213, it is determined whether or not the hard disk 17 is to be formatted. If the hard disk 17 is to be formatted, a loading operation is carried out in a step S214, and in the following step S215, the hard disk 17 is formatted. Then, in a step S216, a message to the effect that the formatting is completed is displayed on the display device, and the format information is stored in the nonvolatile semiconductor memory 60 in a step S217, followed by terminating the present loading process.

If the hard disk 17 is not to be formatted in the step S213, the removable hard disk cartridge 1 is electrically disconnected from the main unit 2 in the step S218, followed by terminating the present loading process. This prevents the removable hard disk cartridge 1 from being loaded into the main unit 2, thereby enabling the same to be removed from the main unit 2 immediately.

As described heretofore, according to the first and second embodiments, when the automatic loading/ejecting mechanism is employed to load/unload a removable hard disk cartridge 1, a removable hard disk cartridge 1 unformatted or formatted in a format that cannot be handled, or a removable hard disk cartridge 1 to which the user has no access right can be removed from the main unit 2 in a shorter time than in the prior art.

Next, a description will be given of a portable storage device according to a third embodiment of the present invention.

Figure 8:
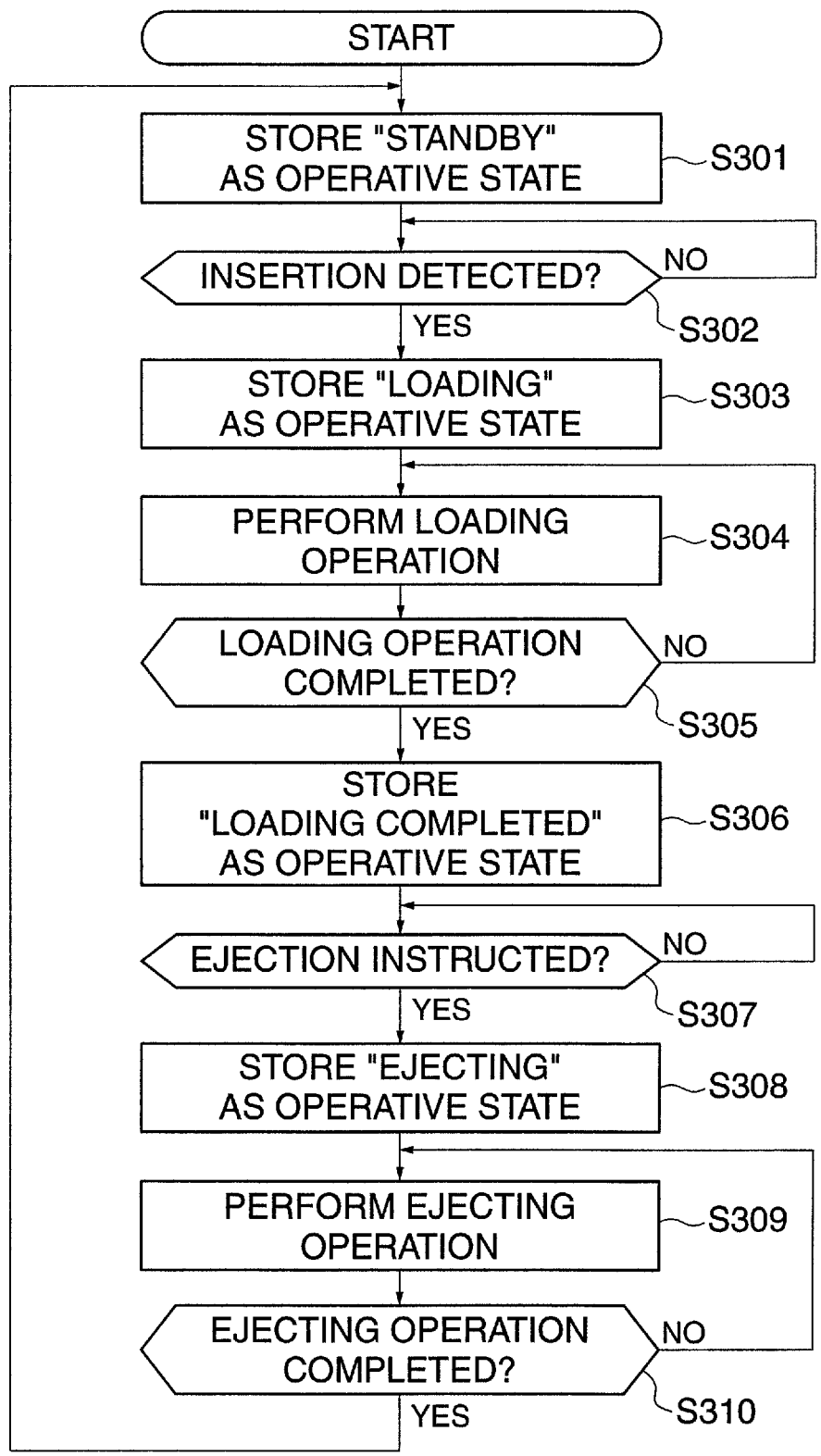
FIG. 8 is a flowchart of a loading/ejecting process executed by a portable storage device according to a third embodiment of the present invention.

FIG. 8 is a flowchart of a loading/ejecting process executed by the portable storage device of the third embodiment. The portable storage device is identical in construction to that of the first embodiment, and therefore illustration and description thereof are omitted.

A state storage area for storing an operative state of the automatic loading/ejecting mechanism 5 is provided in advance in a RAM (not shown) of the microprocessor 40. First, in a step S301, a state "standby" is stored as the operative state in the state storage area. Then, in a step S302, it is determined whether or not insertion of the removable hard disk cartridge 1 has been detected. If the insertion of the removable hard disk cartridge 1 has been detected, a state "loading" is stored as the operative state in the state storage area in a step S303, and then in a step S304, the pulse motor 8 is driven so as to carry out a loading operation.

Then, it is determined in a step S305 whether or not the loading operation is completed. If the loading operation is completed, the process proceeds to a step S306, wherein a state "loading completed" is stored as the operative state in the state storage area.

Then, it is determined in a step S307 whether or not ejection of the removable hard disk cartridge 1 has been instructed. If the ejection has been instructed, a state "ejecting" is stored as the operative state in the state storage area in a step S308, and in a step S309, the pulse motor 8 is driven so as to carry out an ejecting operation. Then, it is determined in a step S310 whether or not the ejecting operation is completed. If the ejecting operation is completed (YES to S310), the process returns to the step S301. If the ejecting operation is not completed yet, completion of the ejecting operation is awaited, and after completion of the ejecting operation, the process returns to the step S301.

Figure 9:
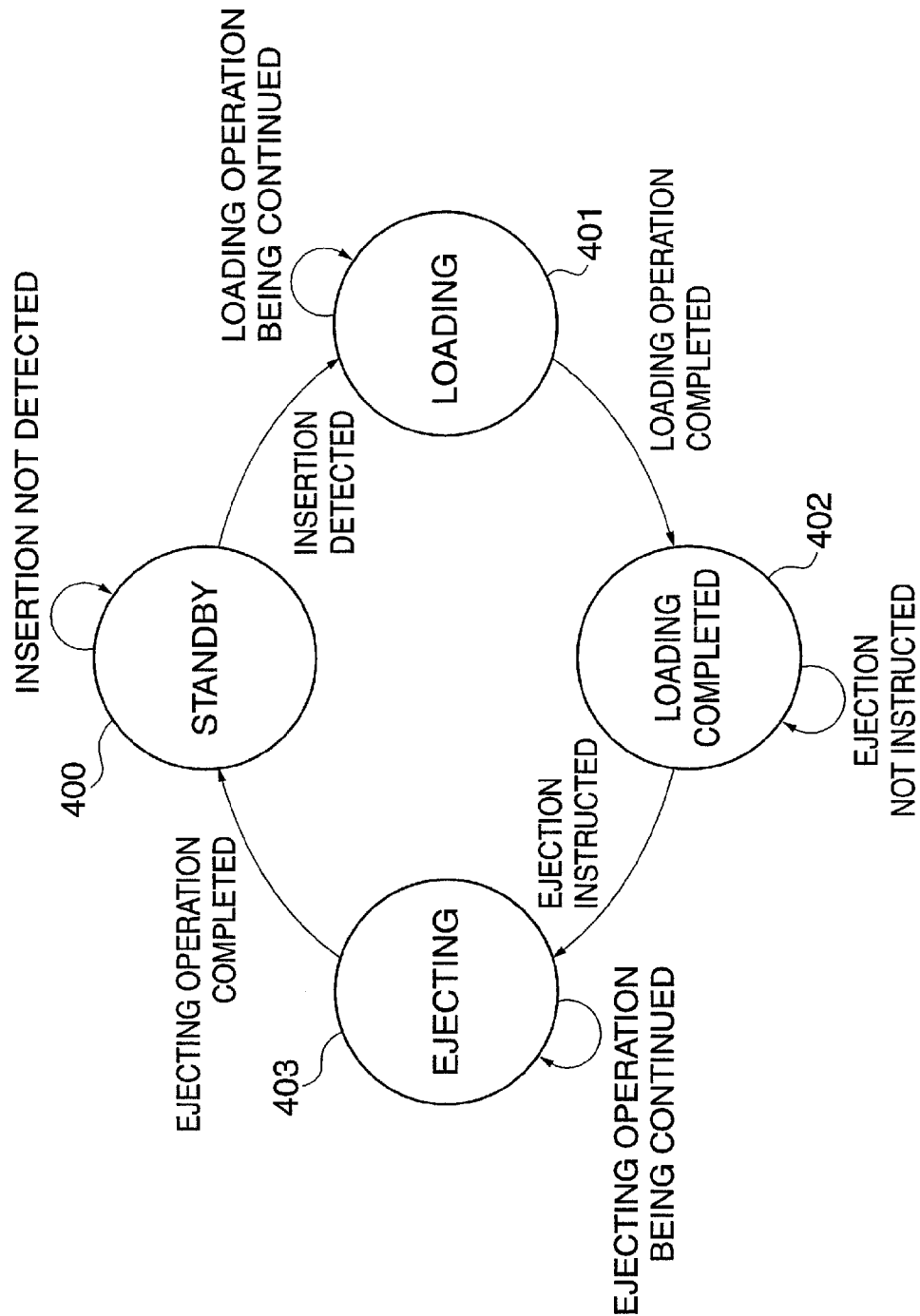
FIG. 9 is a diagram showing changes with time in the operative state of the automatic loading/ejecting mechanism, according to the flowchart in FIG. 8.

FIG. 9 is a diagram showing changes with time in the operative state of the automatic loading/ejecting mechanism 5 according to the flowchart in FIG. 8.

Insofar as insertion of the removable hard disk cartridge 1 is not detected, the automatic loading/ejecting mechanism 5 is in a state designated by reference numeral 400, i.e. the state "standby". When the insertion of the removable hard disk cartridge 1 is detected, the operative state of the automatic loading/ejecting mechanism 5 is changed from the state 400 to a state designated by reference numeral 401, i.e. the state "loading". The state 401 is maintained insofar as the loading operation continues. When the loading operation is completed, the operative state of the automatic loading/ejecting mechanism 5 is changed from the state 401 to a state designated by a reference numeral 402, i.e. the state "loading completed". Before the ejection is instructed, the state 402 is maintained, and subsequently when the ejection is instructed, the operative state is changed from the state 402 to a state 403, i.e. "ejecting". The state 403 is maintained insofar as the ejecting operation continues. When the loading operation is completed, the operative state returns to the state 400. In short, the operative state of the automatic loading/ejecting mechanism 5 is determined to be any one of the four states, i.e. "standby", "loading", "loading completed", and "ejecting", according to the process shown in the flowchart in FIG. 8.

Figure 10:
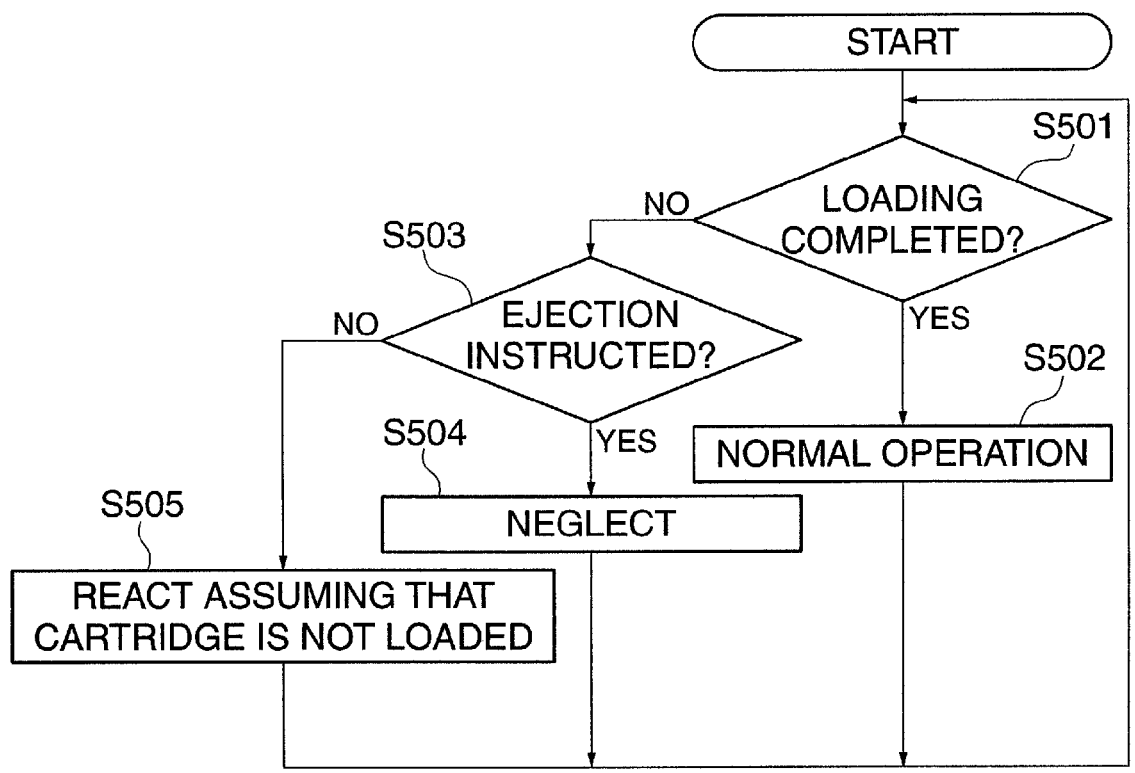
FIG. 10 is a flowchart of a process for handling disk control-related tasks.

FIG. 10 is a flowchart of a process for handling disk control-related tasks.

First, it is determined in a step S501 whether or not the operative state is "loading completed". If the operative state is "loading completed", the process proceeds to a step S502, wherein the microprocessor 40 controls the disk controller 41 such that the disk controller 41 performs a normal operation. In the normal operation, commands from the host apparatus are normally responded to, and reading from and writing in the removable hard disk cartridge 1 are normally performed.

On the other hand, if the operative state is not "loading completed", the process proceeds to a step S503, wherein it is determined whether or not a command received from the host apparatus instructs the ejection of the removable hard disk cartridge 1. If the command instructs the ejection, no processing operation is executed in a step S504 with the ejecting instruction neglected, and the process returns to the step S501. The ejecting instruction is not notified to the ejecting task of the loading/ejection process described in FIG. 8, either. If it is determined in the step S503 that the received command does not instruct the ejection, the disk controller 41 performs in a step S505 an operation assuming that the hard disk drive device 10 does not exist physically ahead of or on the distal end side of the interface circuit included in the disk controller 41, i.e. that the removable hard disk cartridge 1 is not loaded in the main unit 2. In short, the microprocessor 40 controls the disk controller 41 such that the disk controller 41 reacts to commands from the host apparatus assuming that the removable hard disk cartridge 1 is not loaded in the main unit 2, irrespective of whether or not the removable hard disk cartridge 1 is actually loaded.

As described above, according to the present embodiment, during a loading operation or an ejecting operation, the disk controller 41 is caused to react just as in the case where the removable hard disk cartridge 1 is not loaded in the main unit 2, whereby access to the hard disk 17 of the removable hard disk cartridge 1 is inhibited during the loading or ejecting operation. This makes it possible to realize a portable storage device which can operate without a hitch even when a loading/ejecting operation is carried out at a higher speed than in the conventional portable storage devices.

Although in the above described third embodiment, the portable storage device has been described as an independent or separate device, the portable storage device may be incorporated in an electronic information apparatus, such as a personal computer. Hereafter, the portable storage device incorporated in an electronic information apparatus will be described as a fourth embodiment.

Figure 11:
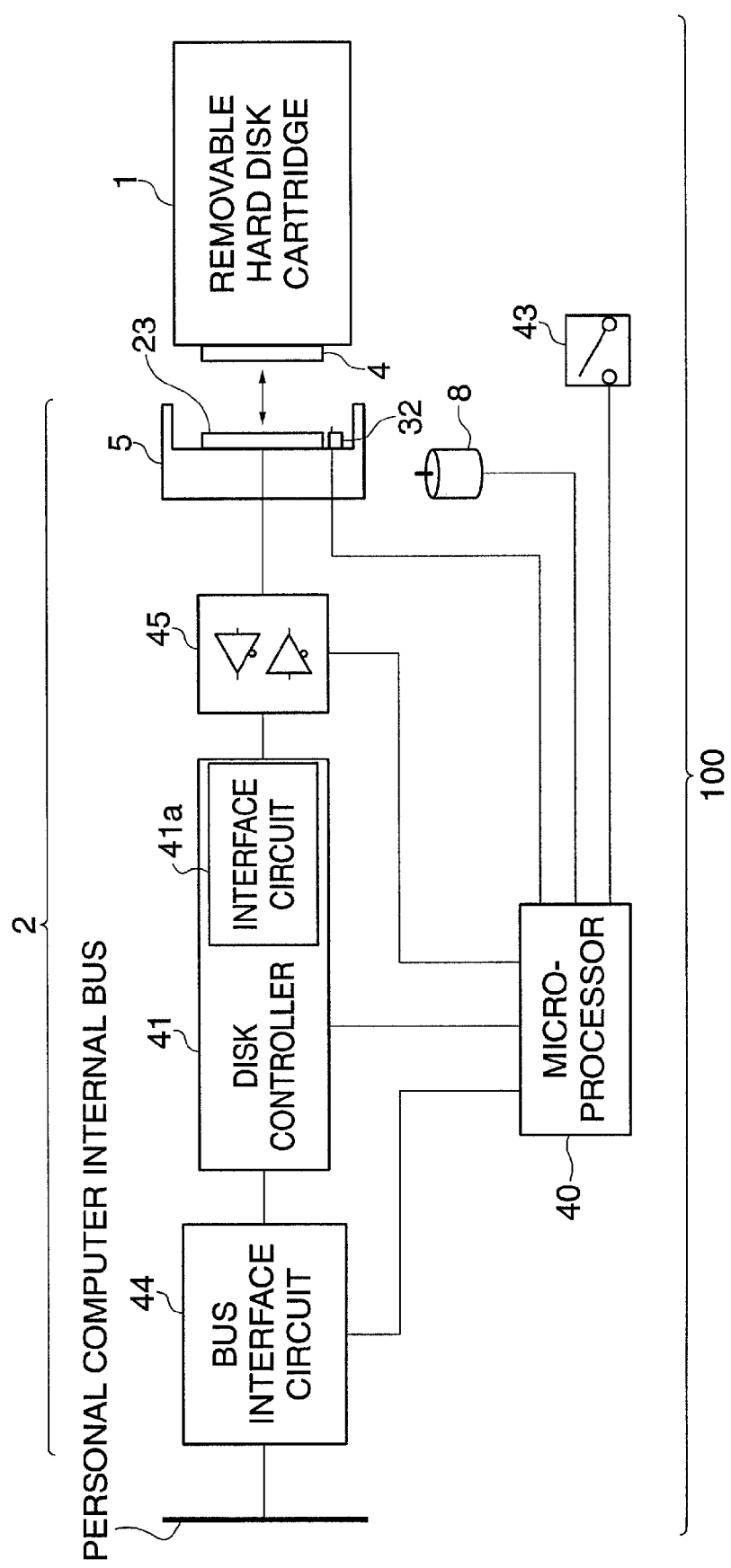
FIG. 11 is a block diagram schematically showing the arrangement of a removable hard disk cartridge and a main unit for receiving the cartridge, of a portable storage device according to a fourth embodiment of the present invention.

FIG. 11 is a block diagram showing the arrangement of a removable hard disk cartridge and a main unit for receiving the same, according to the fourth embodiment.

The portable storage device 100 shown in FIG. 11 is distinguished from that of the first embodiment shown in FIG. 2 in that it includes a bus interface circuit 44 in place of the host apparatus interface circuit 42 and has a tri-state buffer 45 inserted between the disk controller 41 and the connector 23. The other component parts and elements designated by reference numerals 1, 4, 5, 8, 23, 32, 40, 41, 41a, 43 are identical to the respective corresponding ones described with reference to FIG. 2. For the microprocessor 40, there may be commonly used a CPU of the personal computer.

A bus interface within the personal computer can be implemented e.g. by a PCI bus. More specifically, since the portable storage device 100 is incorporated in the personal computer, an internal bus interface, such as the PCI bus, can be used in place of the above-mentioned interface, such as the USB, the IEEE 139, or the like, for connection between the portable storage device 100 and the host apparatus.

The tri-state buffer 45 is inserted into a part or all of signal lines (except bidirectional signal lines) of the interface between the disk controller 41 and the hard disk drive 10, and is responsive to a control signal from the microprocessor 40, for electrically cutting off signals to be transmitted through the signal lines (i.e. brings the signal lines into a high impedance state). As a result, even when the connector 4 and the connector 23 are physically fitted with each other, it is possible to create a state in which logically the disk drive device 10 does not exist ahead of or on the distal end side of the interface circuit 41a included in the disk roller 41.

Figure 12:
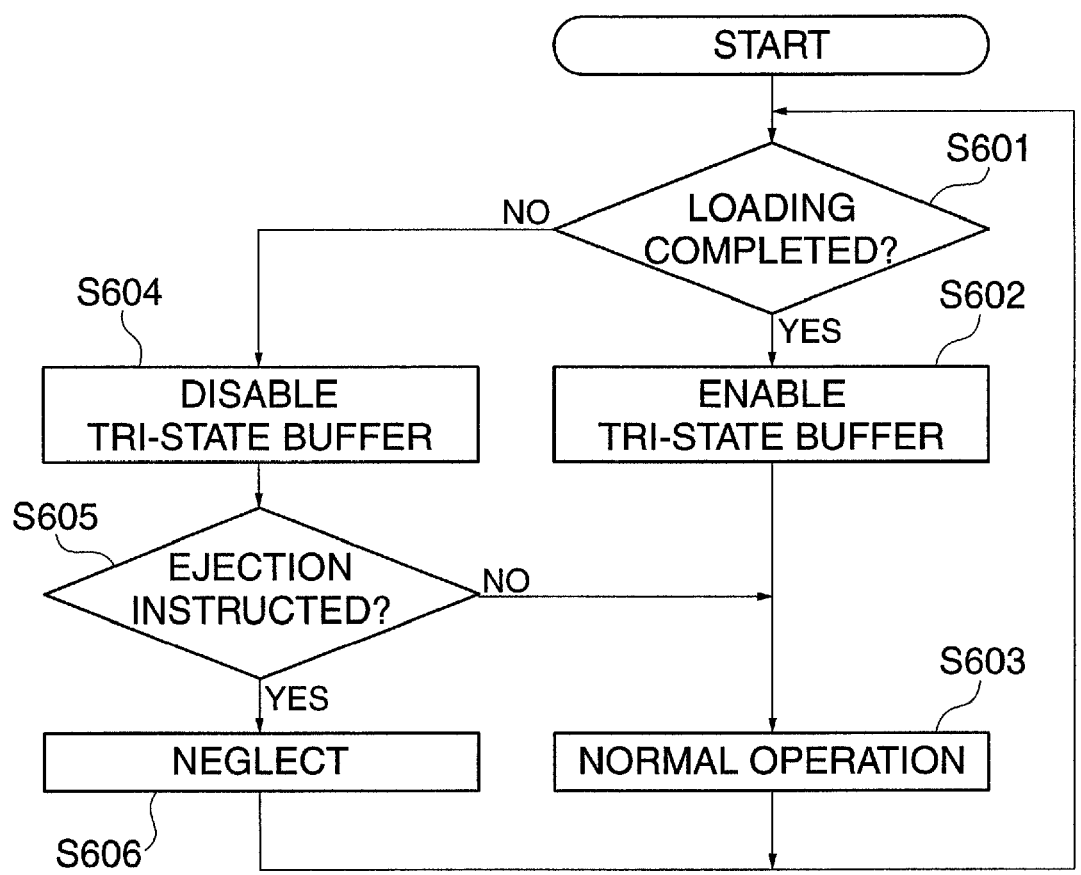
FIG. 12 is a flowchart of a process for handling disk control-related tasks, which is executed by the portable storage device according to the fourth embodiment.

FIG. 12 is a flowchart of a process for handling disk control-related tasks, which is executed by the portable storage device according to the fourth embodiment.

First, it is determined in a step S601 whether or not the operative state is "loading completed". If the operative state is "loading completed", the process proceeds to a step S602, wherein the tri-state buffer 45 is enabled. Then, in a step S603, the microprocessor 40 controls the disk controller 41 to perform a normal operation. In the normal operation, commands from the host apparatus are normally responded to, and reading from and writing in the removable hard disk cartridge 1 are normally performed.

On the other hand, if it is determined in the step S601 that the operative state is not "loading completed", the process proceeds to a step S604, wherein the tri-state buffer 45 is disabled. At this time point, the portable storage device 100 comes into a state equivalent to the state in which the removable hard disk cartridge 1 is not loaded, irrespective of whether or not the removable hard disk cartridge 1 is physically loaded.

Then, in a step S605, it is determined whether or not a command from the host apparatus instructs the ejection. If the command instructs the ejection, no processing operation is executed in a step S606 with the ejecting instruction neglected. The ejecting instruction is not notified to the ejecting task of the loading/ejection process described in FIG. 8, either. If the received command does not instruct the ejection, in the step S603, the microprocessor 40 controls the disk controller 41 to perform a normal operation. The normal operation here includes operations performed in response to commands received when the removable hard disk cartridge 1 is actually unloaded.

In the processing according to the third embodiment, the unloaded state of the removable hard disk cartridge 1 is created by software through processing operation of the microprocessor 40. In the present embodiment, however, due to the operation of the tri-state buffer 45, it appears to the microprocessor 40 and the disk controller 41 as if the removable hard disk cartridge 1 were actually unloaded. Therefore, the disk controller 41 operates in response to commands from the host apparatus, without any special control by the microprocessor 40, as if the removable hard disk cartridge 1 were unloaded.

As described above, according to the present embodiment, by cutting off part or all of the signals to be transmitted through the interface using the tri-state buffer 45 during a loading or ejecting operation, it is possible to inhibit access to the hard disk 17 contained in the removable hard disk cartridge 1 during the loading or ejecting operation.

In the present embodiment, disk control during a loading or ejecting operation can be performed merely by disabling the tri-state buffer 45, which makes the disk control relatively easier to perform than in the other embodiments described herein before.

It is to be understood that the objects of the present invention can be accomplished by supplying a computer or a CPU with software programs which realize functions (corresponding to flowcharts in FIGS. 5, 7A, 7B, 8, 10, and 12) of the above described embodiments, and causing the computer or the CPU to read out and execute the supplied programs.

In this case, each of the programs is directly supplied from a storage medium storing the program, or supplied by being downloaded from another computer, not shown, or a database, not shown, connected to the Internet, a commercial network, a local area network, or the like.

The above described programs may be in the form of an object code, a program code which is executed by an interpreter, or script data which is supplied to an OS (operating system).

Further, it also goes without saying that the object of the present invention may be accomplished by supplying a system or apparatus with a storage medium storing a program code of software realizing the functions of any of the above described embodiments, and causing a computer (CPU or MPU) of the system or apparatus to read out and execute the program stored in the storage medium.

When a program code is employed, the program code itself read from the storage medium realizes the functions of any of the above described embodiments, and therefore the storage medium on which the program code is stored constitutes the present invention.

Examples of the storage medium for supplying the program code include a ROM, a RAM, an NV-RAM, a floppy (registered trademark) disk, a hard disk, an optical disk, a magneto-optical disk, a CD-ROM, an MO, a CD-R, a CD-RW, a DVD-ROM, a DVD-RAM, a DVD-RW, a DVD+RW, a magnetic tape, and a nonvolatile memory card.

Further, it is to be understood that the functions of any of the above described embodiments may be accomplished not only by executing a program code read out by a computer, but also by causing an OS (operating system) or the like which operates on the computer to perform a part or all of the actual operations based on instructions of the programs.

Further, it is to be understood that the functions of any of the above described embodiments may be accomplished by writing a program code read out from the storage medium into a memory provided on an expansion board inserted into a computer or in an expansion unit connected to the computer and then causing a CPU or the like provided in the expansion board or the expansion unit to perform a part or all of the actual operations based on instructions of the program code.

What is claimed is:

1. A portable storage device comprising:
a main unit including a receiving and ejecting device that receives a storage cartridge from an outside of said main unit into a predetermined inner position within said main unit, and ejects said storage cartridge out of said main unit from the predetermined inner position, and a storage operation control device that controls storage operation for storing data in said storage cartridge,
wherein said storage cartridge includes a storage medium, another storage medium storing format information and access right information of said storage medium, a storage medium control device that performs writing of data in said storage medium and reading of data from said medium, and a casing that contains said storage medium and said storage medium control device;
an accessibility determining device that determines whether or not access to contents recorded on said storage medium can be gained based on the format information and the access right information stored in the another storage medium, wherein said accessibility determining device tries to access said storage medium to determine whether or not the access can be gained, when said accessibility determining device cannot determine that the access can be gained based on the format information and the access right information; and
a reception inhibiting device that inhibits said receiving and ejecting device from performing the receiving operation when said accessibility determining device determines that the access can not be gained.

2. A portable storage device as claimed in claim 1, wherein the another storage medium is a nonvolatile semiconductor memory.

3. A portable storage device as claimed in claim 1, wherein said accessibility determining device determines whether or not the access can be gained by determining whether or not said storage medium is formatted.

4. A portable storage device as claimed in claim 3, wherein said receiving and ejecting device is responsive to a determination by said accessibility determining device that the access can be gained, for receiving said storage cartridge into the predetermined inner position substantially simultaneously with completion of the determination.

5. A portable storage device as claimed in claim 3, further comprising a notification device which is responsive to a determination by said accessibility determining device that the access cannot be gained, for notifying a user that the access cannot be gained.

6. A portable storage device as claimed in claim 5, further comprising a format process device which is responsive to a determination by said accessibility determining device that the access cannot be gained, for asking the user whether or not said storage medium is to be formatted, and is responsive to an instruction by the user that said storage medium is to be formatted, for causing said storage cartridge to be received into the predetermined inner position and formatting said storage medium in a controllable format.

7. A portable storage device as claimed in claim 1, wherein said accessibility determining device determines whether or not the access can be gained by determining whether or not said storage medium is controllably formatted.

8. A portable storage device as claimed in claim 1, wherein said accessibility determining device determines whether or not the access can be gained by determining whether or not a user has an access right to said storage medium.

9. A portable storage device as claimed in claim 1, wherein format information of a format of said storage medium is written into the another storage medium.

10. A portable storage device as claimed in claim 1, wherein when an access right is changed during use of said storage cartridge, the access right information on the changed access right is written into the another storage medium.

11. An electronic information apparatus including the portable storage device as claimed in claim 1.

12. A method of controlling a portable storage device, comprising:
a storage medium control step of performing writing of data in a storage medium contained in a storage cartridge and reading of data from the storage medium;
a receiving and ejecting step of receiving the storage cartridge from outside a main unit into a predetermined inner position within the main unit, and ejecting the storage cartridge out of said main unit from the predetermined inner position;
an accessibility determining step of determining whether or not access to contents recorded on said storage medium can be gained based on the format information and the access right information stored in another storage medium contained in the storage cartridge and trying to access said storage medium when not being able to determine that the access can be gained based on the format information and the access right information; and
an reception inhibiting step of inhibiting the receiving operation from being performed in said receiving and ejecting step when it is determined in said accessibility determining step that the access can not be gained.

* * * * *